United States Patent [19]
Baker et al.

[11] Patent Number: 5,869,896
[45] Date of Patent: Feb. 9, 1999

[54] PACKAGED ELECTRONIC MODULE AND INTEGRAL SENSOR ARRAY

[75] Inventors: Robert Grover Baker, Delray Beach, Fla.; Claude Louis Bertin, South Burlington; Wayne John Howell, Williston, both of Vt.; Joseph Michael Mosley, Boca Raton, Fla.

[73] Assignee: International Business Machines Corporation, Armonk, N.Y.

[21] Appl. No.: 31,019

[22] Filed: Feb. 26, 1998

Related U.S. Application Data

[62] Division of Ser. No. 592,933, Jan. 29, 1996, Pat. No. 5,763,943.

[51] Int. Cl.⁶ .......................... H01L 23/34; H01L 23/02
[52] U.S. Cl. .......................... 257/724; 257/680; 257/684; 257/723
[58] Field of Search .......................... 257/680, 684, 257/686, 693, 723, 724

[56] References Cited

U.S. PATENT DOCUMENTS

| | | | |
|---|---|---|---|
| 4,403,238 | 9/1983 | Clark | 357/30 |
| 4,654,694 | 3/1987 | Val . | |
| 4,660,066 | 4/1987 | Reid | 357/30 |
| 4,706,166 | 11/1987 | Go | 361/403 |
| 4,761,681 | 8/1988 | Reid | 357/68 |
| 5,016,138 | 5/1991 | Woodman | 361/381 |
| 5,021,888 | 6/1991 | Kondou et al. | 358/213.11 |
| 5,051,865 | 9/1991 | Kato | 361/386 |
| 5,055,930 | 10/1991 | Nagasaki et al. | 358/213.11 |
| 5,347,428 | 9/1994 | Carson et al. | 361/760 |
| 5,424,920 | 6/1995 | Miyaka | 361/735 |
| 5,432,729 | 7/1995 | Carson et al. | 365/63 |
| 5,502,667 | 3/1996 | Bertin et al. | 365/51 |
| 5,517,057 | 5/1996 | Beilstein, Jr. et al. | 257/686 |
| 5,561,593 | 10/1996 | Rotolante | 361/735 |
| 5,604,377 | 2/1997 | Palagonan | 257/685 |
| 5,612,570 | 3/1997 | Eide et al. | 357/686 |
| 5,633,530 | 5/1997 | Hsu | 257/685 |
| 5,760,478 | 6/1998 | Bozso et al. | 257/777 |
| 5,767,564 | 6/1998 | Kunimatsu et al. | 257/532 |

FOREIGN PATENT DOCUMENTS

| | | |
|---|---|---|
| 5-110959 | 4/1993 | Japan . |
| 5-268535 | 10/1993 | Japan . |
| WO93/11631 | 6/1993 | WIPO . |

*Primary Examiner*—Ngân V. Ngô
*Attorney, Agent, or Firm*—Heslin & Rothenberg, P.C.

[57] ABSTRACT

An electronic module includes multiple stacked bare IC chips ("a stack") and a sensor assembly that is mechanically coupled to an end surface of the stack. Electrical connection between the sensor assembly and the stack is provided by a metallization layer disposed on a side-surface of the stack. Specifically, wiring of the sensor assembly extends to an edge surface thereof corresponding to the side-surface of the stack where it electrically connects to the side-surface wiring. The IC chips of the stack are similarly electrically connected to the side-surface wiring. Multiple sensors (e.g., CCD arrays) may be electrically and mechanically coupled to multiple surfaces of the stack for providing a, e.g., multi-view imaging module. Multiple electrical and mechanical options exist for the connection of sensors to stacks within electronic modules.

7 Claims, 10 Drawing Sheets

PACKAGED ELECTRONIC MODULE AND INTEGRAL SENSOR ARRAY

This application is a division of application Ser. No. 08/592,933, filed Jan. 29, 1996, now U.S. Pat. No. 5,763,943.

TECHNICAL FIELD

This invention relates in general to electronic modules formed by stacking multiple bare semiconductor (e.g., integrated circuit—"IC") chips. More specifically the present invention relates to electronic modules having sensor arrays integral therewith.

BACKGROUND OF THE INVENTION

The acquisition of real world data for use by digital computing systems remains a challenge, even in view of the continuous evolution of computer and sensor technology. Acquiring accurate data, in real-time, and effectively organizing such data for processing and/or transfer continues to present engineering problems requiring solutions. Further, the need exists for the integration of data acquisition and processing circuitry with corresponding sensors in increasingly small packages.

Many forms of digital imaging equipment including, for example, digital still and motion cameras require the acquisition and processing of visual image data. Conventionally, the sensor used to perform such acquisition has been the Charge Coupled Device (CCD) or the Charge Injection Device (CID). As is well known, each of these devices is fabricated as a semiconductor chip having an array of sensors responsive to light energy (IR and visible). Techniques for integrating processing circuitry with such sensors such that digital images may be acquired in a faster, higher-quality manner with more efficient processing and storage thereof are accordingly advantageous.

Certain imaging applications such as, e.g., virtual reality, multimedia and surveillance require real-time images comprising a wide field of view. Previous techniques for acquiring such images required large, cumbersome multi-camera arrays, complex and expensive wide field of view lenses (that introduce significant image distortion) and non-real time mechanically scanned imagers. Thus, no small, lightweight, real-time, wide field of view imager has heretofore been possible.

The present invention is directed to solutions for the above discussed problems.

SUMMARY OF THE INVENTION

Briefly described, in a first aspect, the present invention includes an electronic module comprising multiple chips that are stacked, each chip comprising a bare chip having an edge surface. At least one of the chips has a transfer metal lead extending to its edge surface. A main surface of an end chip of the multiple chips defines an end chip surface. The electronic module further includes a sensor assembly disposed adjacent to and coupled to the end chip surface such that the sensor assembly is disposed substantially parallel to the end chip surface. Specifically, the sensor assembly comprises a sensor substrate having an edge surface and having wiring terminating at the edge surface for facilitating electrical connection to the sensor assembly. The edge surface of the sensor assembly and the edge surfaces of the multiple chips are aligned and form a substantially planar side surface of the electronic module. A metallization layer is disposed on the side surface of the electronic module and is electrically coupled to both the wiring of the sensor assembly and to the transfer metal lead of the at least one chip for facilitating electrical connection therebetween.

In another aspect, the present invention includes an electronic module comprising a substrate having a cavity therein which defines a first supporting level of the substrate within the cavity. The electronic module further includes a processing module that is mechanically connected to the first supporting level. The processing module comprises a stack of chips. Also included within the electronic module is a sensor assembly disposed within the cavity and mechanically coupled to the substrate, and electrical connection means between the processing module and the sensor assembly.

In yet another aspect, the present invention comprises a sensor apparatus including a chip stack having multiple bare chips that are stacked and at least two faces. The sensor apparatus further includes a first sensor, a second sensor and electrical coupling means. The first sensor is mechanically coupled to a first face of the chip stack, while the second sensor is mechanically coupled to a second face of the chip stack. The electrical coupling means electrically connects the first sensor to the chip stack, and the second sensor to the chip stack.

The present invention has numerous advantages and features associated with it. By providing very high integration of a sensor and processing electronics in a monolithic electronic module, several advantages result. First, the close proximity of the sensor to the processing electronics substantially improves signal quality through improved signal-to-noise ratio and bandwidth. Further, the ability to perform extensive signal processing within the monolithic electronic module itself relieves a separate, external processor from signal processing functions. In embodiments wherein an electronic module includes multiple sensor arrays coupled to multiple surfaces thereof, an electronic module capable of, e.g., imaging in nearly a full sphere simultaneously results. Moreover, the processing power of the IC chips of the module facilitate enhanced functionality such as the "stitching" of the multiple images together to form a continuous spherical image. The need for large cumbersome multi-directional imaging devices is accordingly obviated. The art of data acquisition and imaging is thereby advanced.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT

The present invention advances the art of sensor technology by providing higher level integration of sensor arrays and associated electronics than was heretofore possible. Both sensor arrays and associated processing electronics are integrated into a monolithic electronic module. As used herein, the term "monolithic electronic module" is defined as an electronic module comprising multiple bare semiconductor chips (i.e. semiconductor dies), laminated together into a unified stack. Substrates without circuitry, but including integral wiring, may be included in the module for specialized functions such as, e.g., connection to a sensor array. The individual semiconductor chips each have a particular function (e.g., memory, logic, processor, communications, and sensing) with respect to the electronic module.

As understood in the art, individual bare semiconductor chips (e.g., IC chips) and substrates within monolithic electronic modules may each have a transfer metal layer for facilitating electrical connection thereto. Transfer metal leads in this layer extend from active circuitry within each IC chip to an edge surface(s) of the IC chip. As the edge surfaces of all of the IC chips are aligned, a substantially planar side surface on the resultant electronic module with transfer metal leads extending thereto results. Wiring of the IC chips to each other is performed on the side surface using thin-film metallization which electrically connects to the individual transfer metal leads. Substrates within the stack (e.g., endcaps) may also include wiring extending to edge surfaces thereof and are similarly wired.

Figure 1:
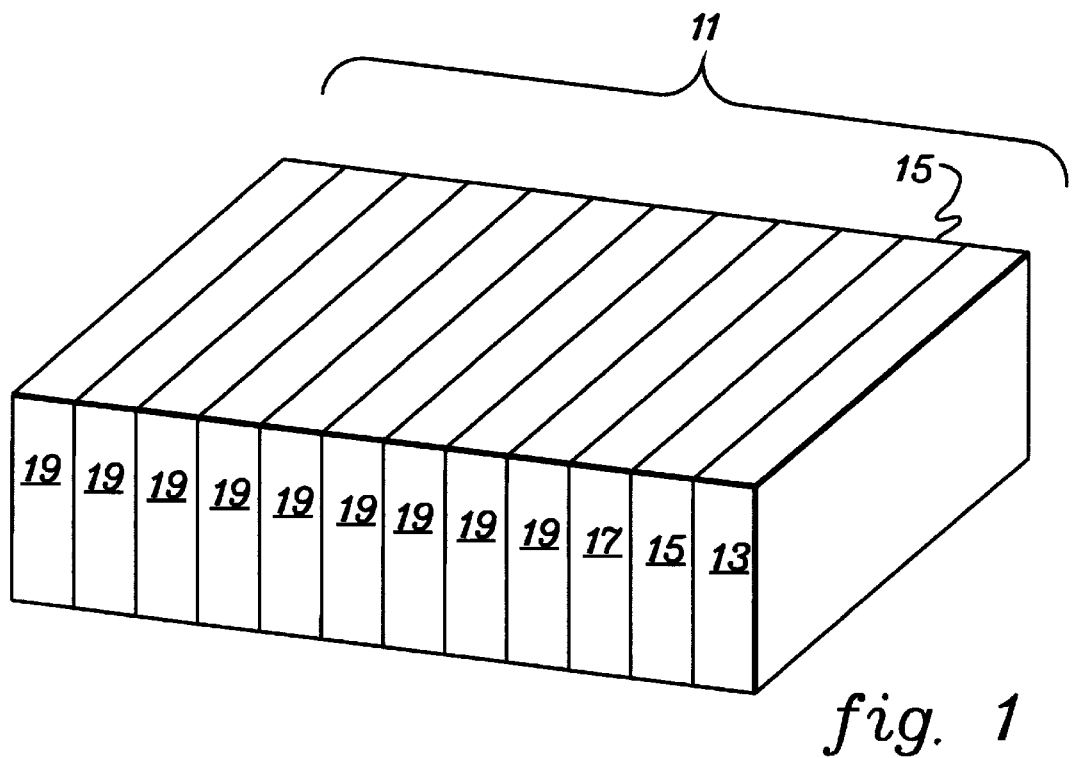
FIG. 1 is an isometric view of a sensor module pursuant to one embodiment of the present invention.

Shown in FIG. 1 is a monolithic electronic module comprising a stack 11 including multiple semiconductor chips and a sensor assembly 13. The sensor information is processed by the IC chips within the stack 11. A signal processing chip 15 is used to perform processing of the signals received from sensor assembly 13. For example, in an embodiment wherein sensor assembly 13 includes a CCD array, signal processing chip 15 produces the control signals needed to operate the CCD array and digitizes the information received therefrom. Further, a digital signal processor (DSP) is included within signal processor chip 15 for, e.g., image enhancement functionality. As more functionality is required, other IC chips can be added to stack 11, such as, e.g., more DSP chips.

Stack 11 also includes multiple IC memory chips 19 and a control logic chip 17 for control thereof. For example, in an embodiment where memory chips 19 comprise dynamic random access memory (DRAM), control logic IC chip 17 comprises a DRAM controller. This memory may be used in connection with programmable operation of signal processor chip 15, and also may be used for data storage. For example, in digital photography applications, images (e.g., compressed by signal processing chip 15) may be stored in memory chips 19 for later retrieval. Control logic chip 17 also provides functional interfacing of stack 11 to external circuitry.

By providing very high integration of a sensor and processing electronics in a monolithic electronic module, several advantages result. First, the close proximity of the sensor to the processing electronics substantially improves signal quality through improved signal-to-noise ratio and bandwidth. Further, the ability to perform extensive signal processing within the monolithic electronic module itself relieves a separate, external processor from signal processing functions. More compensation and adaptation functionality can be performed in real time, in connection with the operation of the sensor. For example, in an imaging application, exposure and spatial distortion (due to lens irregularities) can be automatically and dynamically controlled using algorithms executing in signal processing chip 15.

Figure 2:
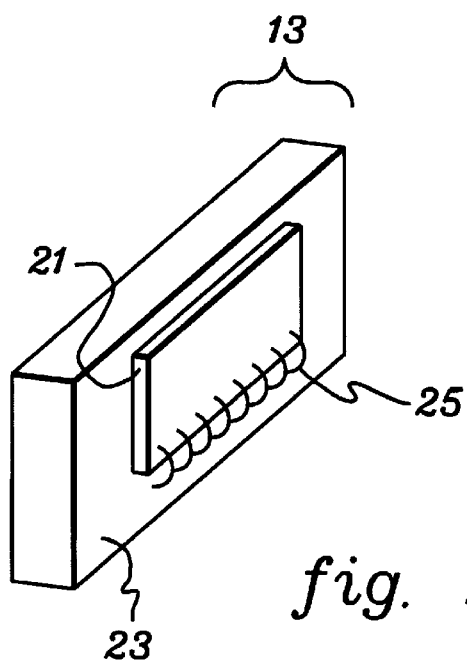
FIG. 2 is an isometric view of the sensor assembly of the sensor module of FIG. 1 according to an embodiment of the present invention.

A more detailed isometric view of sensor assembly 13 is shown in FIG. 2. A sensor substrate 23 provides mechanical support and electrical interconnection functions with respect to sensor assembly 13. More particularly, a sensor array 21 is physically mounted on sensor substrate 23 and comprises, e.g., a charge coupled device (CCD) array. The CCD array is used, e.g., for imaging applications within the visible and infra-red bands of the electromagnetic spectrum. However, the present invention is not limitive of the type of sensor used. Any sensor type that can be mounted on sensor substrate 23 may be used in connection with the techniques disclosed herein. For example, sensor arrays with sensitivity to X-rays are applicable to medical imaging, and atmospheric sensors are applicable to environmental sensing applications.

Sensor array 21 is electrically connected to sensor substrate 23 using wires 25. Other methods for electrical connection are however applicable. For example, if sensor array 21 was fabricated with electrical contacts on its back surface, solder bump bonding techniques could be used to electrically and mechanically couple the sensor array 21 to sensor substrate 23.

Figure 3:
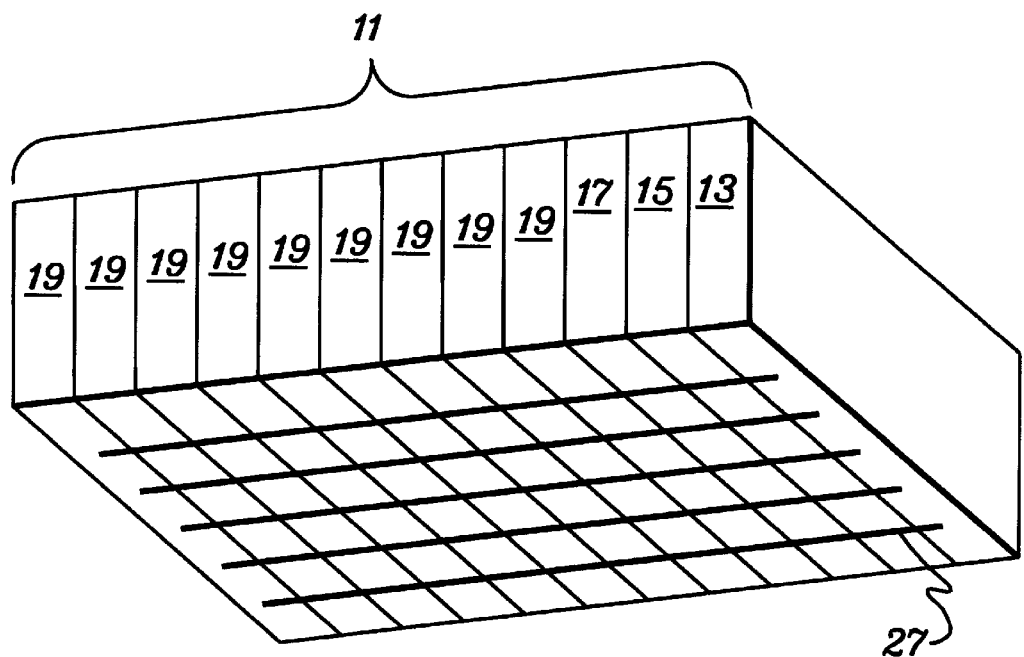
FIG. 3 is an isometric view of the sensor module of FIG. 1 including side surface metallization in conformance with one embodiment of the present invention.

According to the present invention, the wiring between sensor assembly 13 and the IC chips (e.g., 15, 17 & 19) in the stack 11 is provided by a side surface metallization layer 27 as shown in FIG. 3. This metallization layer comprises a thin-film metallization layer formed integral with the side surface of the assembled stack 11. Specifically, after the IC chips (15, 17 & 19) and sensor assembly 13 have been laminated together, a selected side surface (to which the transfer metallization extends) is processed using conventional side surface metallization processes. Advantageously, the use of conventional side surface metallization to interconnect sensor assembly 13 to the IC chips of stack 11 simplifies construction of the monolithic electronic module. The reliability of the resultant monolithic electronic module is therefore increased and fabrication costs are accordingly decreased.

Figure 4:
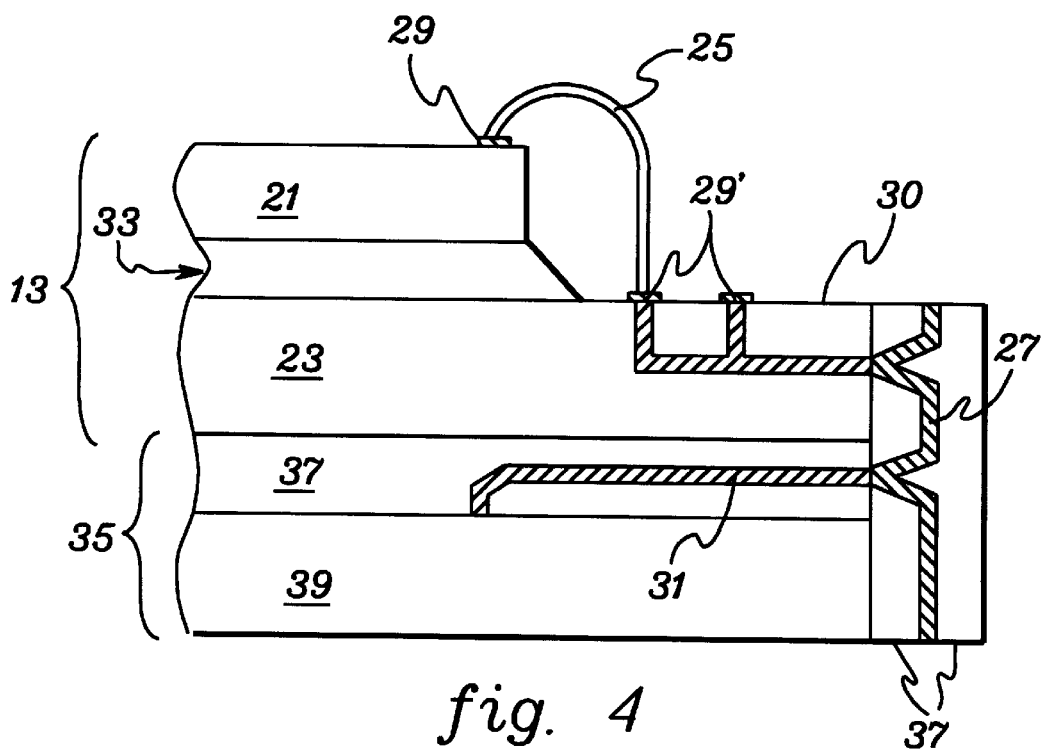
FIG. 4 is a cross-sectional view of a portion of the sensor module of FIG. 1 in accordance with an embodiment of the present invention.

Further details of the completed stack 11 are shown in the cross-sectional view of FIG. 4. Each IC chip in the stack that is connected to side surface metallization 27 incorporates a "transfer metallization" layer for achieving such interconnection. More specifically, IC chip 35 includes a semiconductor substrate 39 (with circuitry formed integral therewith), an insulating layer 37 disposed thereabove, and at least one transfer metal lead 31 (part of the "transfer metal layer") disposed within insulating layer 37. Transfer metal lead 31 extends from a contact point within the circuitry of IC chip 35, across the IC chip within insulating layer 37 and to an edge surface of IC chip 35. This facilitates contact between transfer metal lead 31 and side surface metallization layer 27 at a "T" connect.

In one embodiment, sensor substrate 23 comprises a ceramic endcap having internal wiring 32. The internal wiring 32 provides electrical connection from side surface metallization layer 27 up to wirebond pads 29' on a main surface 30 of sensor substrate 23. Wires 25 connect wirebond pads 29' of sensor substrate 23 to corresponding wirebond pads 29 on sensor array 21. Sensor array 21 is physically connected to main surface 30 using adhesive layer 33. Endcap techniques that facilitate side surface to end surface connectivity and that are usable as sensor substrates may be employed in connection with the techniques of the present invention and include, e.g., (1) multilayer ceramic endcaps, (2) organic "flexcircuit" layers, (3) a separate thin-film layer deposited on the end IC chip in the stack, and (4) an "integral endcap" consisting of incorporation of the necessary wiring in the inter-chip layer on the top of the end IC chip in the stack. In regard to these endcap techniques, reference is made to co-pending U.S. patent applications, "SEMICONDUCTOR CHIP AND ELECTRONIC MODULE WITH INTEGRATED SURFACE INTERCONNECTS/COMPONENTS," Filed Oct. 17, 1995, Ser. No. 08/324/203 and "ELECTRONIC MODULES WITH INTERCONNECTED SURFACE METALLIZATION LAYERS AND FABRICATION METHODS THEREFOR," U.S. Pat. No. 5,466,634, Dated Nov. 14, 1995, which are hereby incorporated by reference herein in their entirety.

Figure 5:
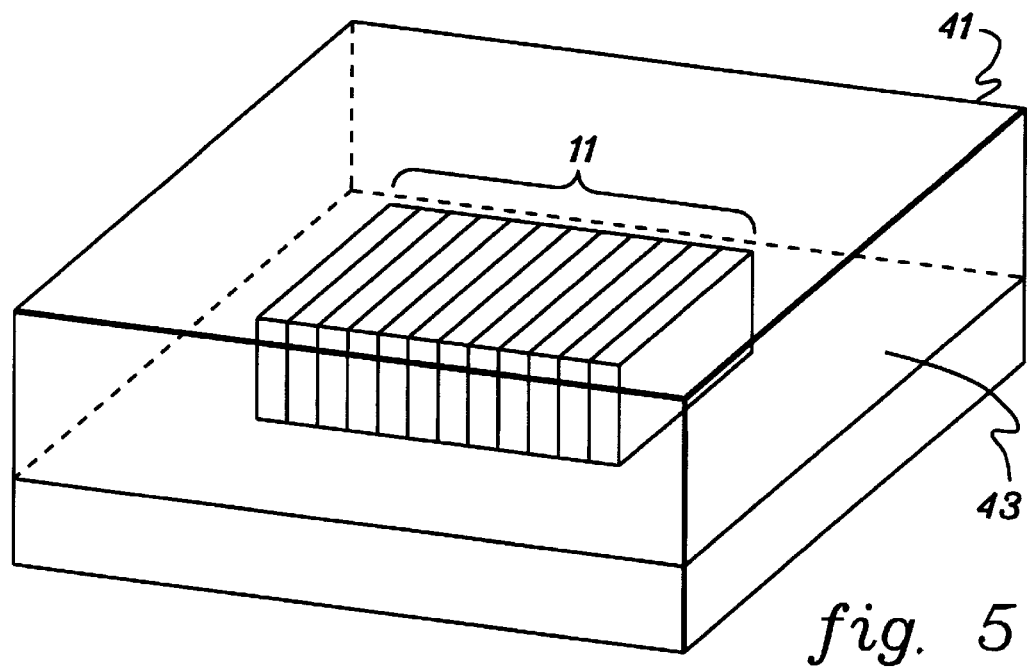
FIG. 5 is an isometric view of the sensor module of FIG. 1 and surrounding module cover pursuant to one embodiment of the present invention.

FIG. 5 is an isometric view of stack 11 having a cover 41 disposed thereon. Cover 41 has an optically transparent window 43 to facilitate imaging. Due to the use of thin-film side surface metallization as an interconnection for the electronic module, a very low profile module is achievable. Advantageously, a substantial volumetric savings in overall packaging results. Further, due to decreased size, electrical signals travel very quickly between components of the module facilitating fast processing and data transfer. Such high integration and small sizing make imaging modules formed using the techniques of the present invention attractive in many applications. For example, the imaging module (i.e., a sensor module using an imaging type sensor such as a CCD) disclosed herein could be mounted in, e.g., thin pocket calculator sized cameras, PCMCIA cards, and covert surveillance locations (e.g., door moldings, book cases, store shelves, etc.).

Figure 6:
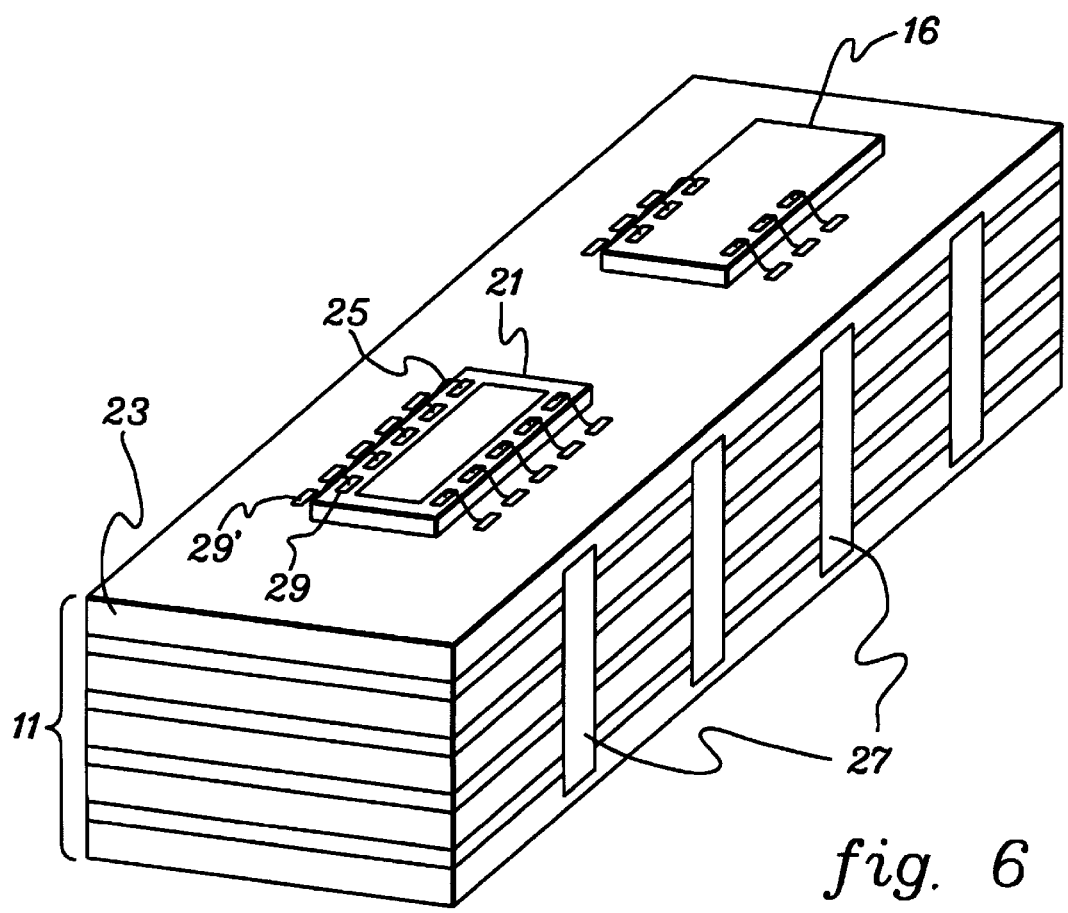
FIG. 6 is an isometric view of a sensor module having both a sensor assembly and a logic/control IC chip on an end surface thereof according to an embodiment of the present invention.

The use of sensor substrate 23 is not limited to only supporting/connecting sensor array 21. In an alternate embodiment of the present invention, a logic/control IC chip 16 can be physically mounted to, and electrically connected to sensor substrate 23 as shown in FIG. 6. Logic/control IC chip 16 can be used to provide a number of valuable functions. For example, logic/control IC chip 16 may provide memory chip management, bit replacement, error-correction, self-test, and a range of customer specific functions (including field programmable logic). A standard stack 11 could be customized using a customer specific logic/control IC chip 16. This feature provides economic advantages as complete stacks 11 could be fabricated in high-volumes at reduced costs, while customer specific IC chips 16 could be fabricated in low volumes as required. A small sized logic/control IC chip 16 enables high-wafer productivity and high-yield, resulting in low cost. As previously discussed, wires 25 are connected to wirebond pads 29 (and 29') to provide electrical connectivity to sensor substrate 23.

Figure 7:
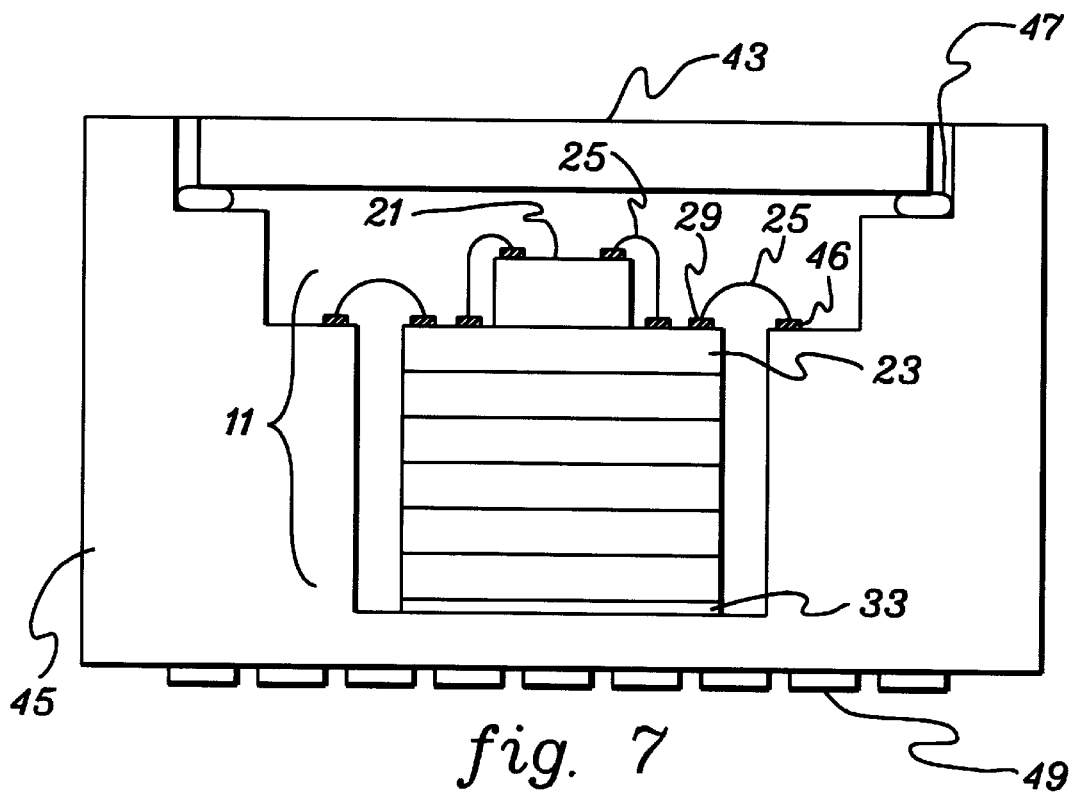
FIGS. 7–9 are cross-sectional views of different embodiments of sensor modules in cavity substrates in conformance with the present invention.

Many packaging options exist for the imaging module of the present invention. In a first embodiment shown in FIG. 7, a cavity substrate 45 having a cavity sized to accommodate stack 11 is provided. Cavity substrate 45 allows stack 11 to be recessed such that a transparent cover 43 (used for environmental protection of sensor array 21) can be placed at a predetermined distance from sensor array 21 and out of its focal plane. Thus, opaque particulate matter (e.g., dust) on transparent cover 43 will not be imaged by sensor array 21. Various environmental applications can be accommodated by the use of a hermetic or non-hermetic seal 47 between transparent cover 43 and cavity substrate 45.

External electrical connection of the completed package is provided by electrical contacts 49 disposed on the bottom of cavity substrate 45. These electrical contacts 49 are electrically connected by wiring within cavity substrate 45 to substrate wirebond pads 46. Electrical contacts 49 may comprise several type of interconnects including, for example, pins, ball-grid-arrays, solder columns, solder bumps, fuzz buttons, tape-automated-bonding and lead-frames. Wires 25 electrically connect substrate wirebond pads 46 to wirebond pads 29 on stack 11. Stack 11 is physically mounted to substrate 45 by an adhesive layer 33.

Figure 8:
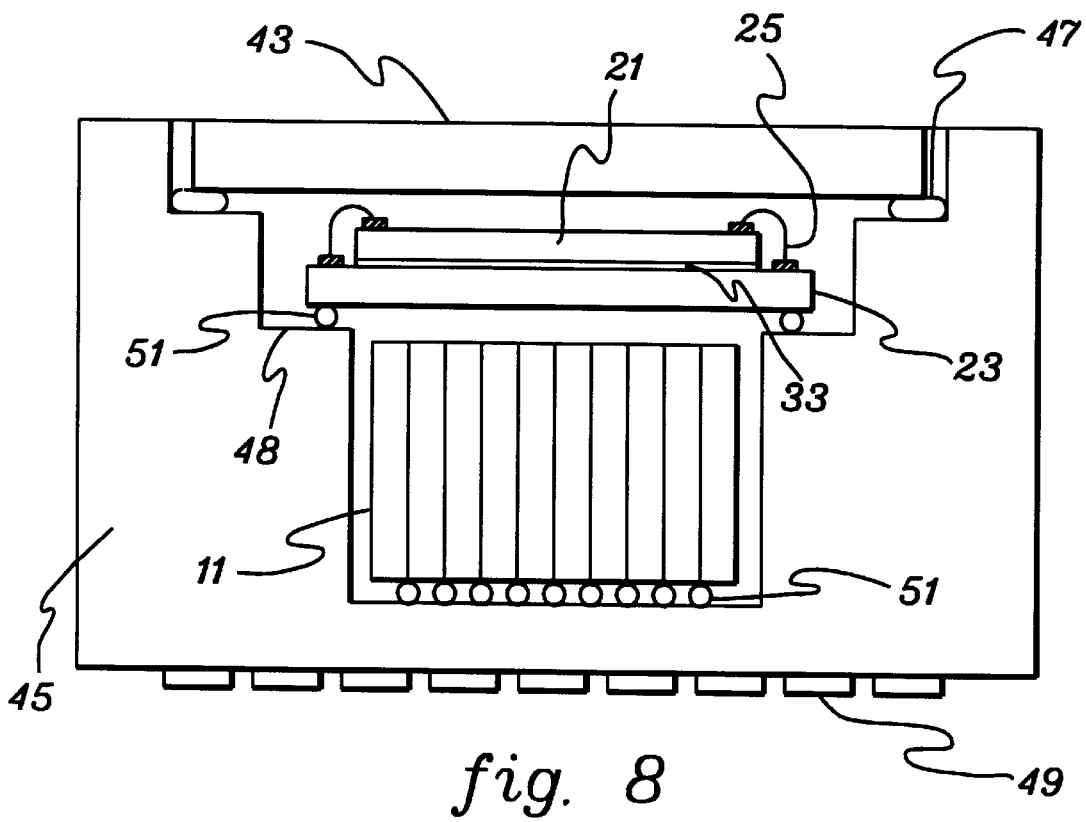

In another embodiment of the present invention shown in FIG. 8, sensor array 21 and sensor substrate 23 are mounted within cavity substrate 45 separately from stack 11. In this embodiment, a "breadloaf" type stack (i.e., having vertical IC chip layers oriented like slices in a loaf of bread) is physically and electrically coupled to cavity substrate 45 using solder bumps 51. Disposed on a ledge 48 within cavity substrate 45, and above stack 11, is sensor substrate 23. This sensor substrate 23 is similar to those previously described, however, in this embodiment the internal wiring terminates both on a lower main surface and an upper main surface of the sensor substrate 23. Using the wiring terminating on the lower main surface, sensor substrate 23 is electrically and physically connected to cavity substrate 45 using solder bumps 51. Sensor array 21 is secured to sensor substrate 23 using adhesive 33 and is electrically connected to sensor substrate 23 using wires 25, all as previously discussed. Wiring within cavity substrate 45 electrically connects stack 11 to the sensor substrate 23.

The configuration shown in FIG. 8 is particularly advantageous for extremely high memory density applications because solder bumps 51 provide a short wiring path between the chip I/O of stack 11 and cavity substrate 45 (through the associated transfer metallurgy and side surface wiring—not shown). This short pathway minimizes wiring congestion. As a further advantage of the configuration of FIG. 8, individual components (e.g., sensor assembly or stack) can be more easily reworked or replaced thereby facilitating repairs and upgrades.

Figure 9:
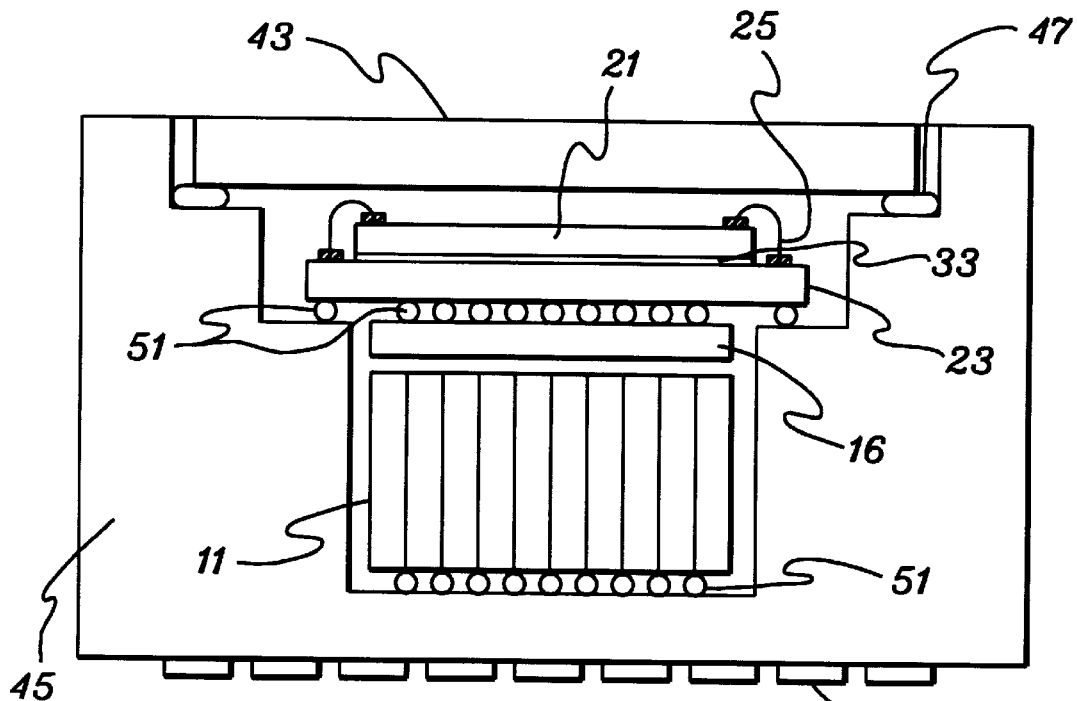

An enhancement to the packaging approach of FIG. 8 is shown in FIG. 9. In this embodiment, a logic/control IC chip 16 has been added to the lower main surface of sensor substrate 23 and is electrically and mechanically coupled thereto using solder bumps 51. As discussed hereinabove in regard to FIG. 6, logic/control IC chip 16 may provide memory chip management, bit replacement, error-correction, self-test, and a range of customer specific functions (including field programmable logic). Depending on available space, a logic/control IC chip could be disposed on either main surface of sensor substrate 23 and is wireable thereto using, e.g., solder bumps or wirebonds.

Further embodiments of the present invention (FIGS. 10–12) use a mounting substrate 53 that does not have a cavity therein (although stacks 11 shown therewith are not precluded from use in cavity substrates). In each of these embodiments, a module cover 41 is disposed over and around the assembled stack 11, and may have a portion (or the entire module cover 41) that is transparent to the physical property being detected by sensor array 21 (e.g., visible light).

Figure 10:
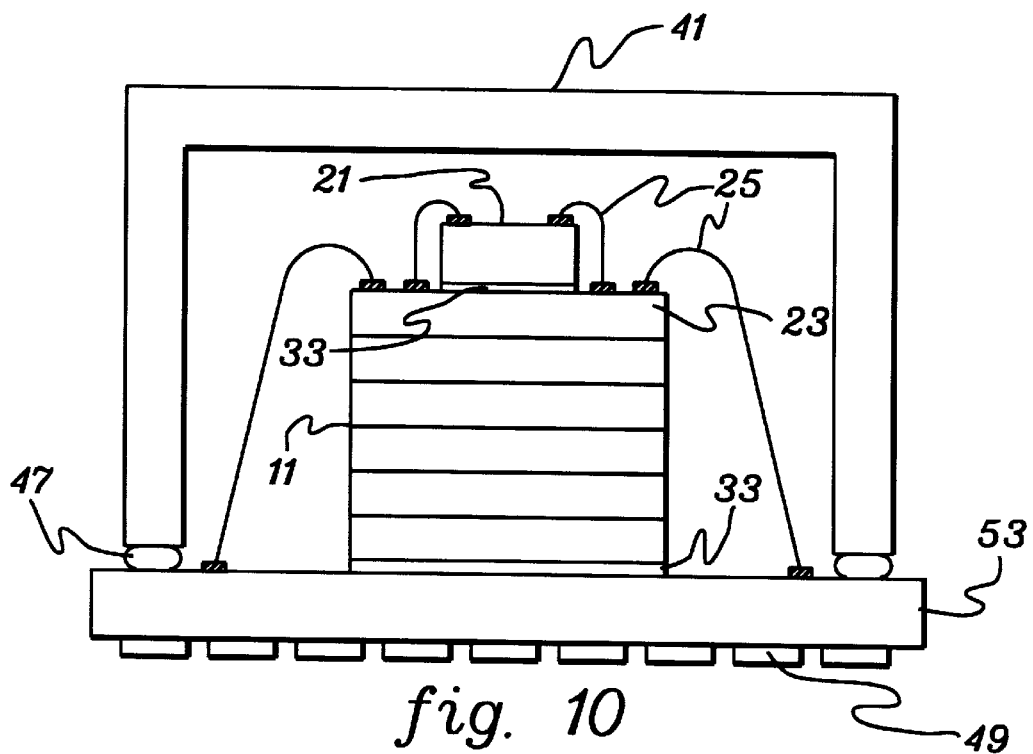
FIGS. 10–12 are cross-sectional views of different embodiments of sensor modules and associated mounting substrates in accordance with the present invention.
Figure 11:
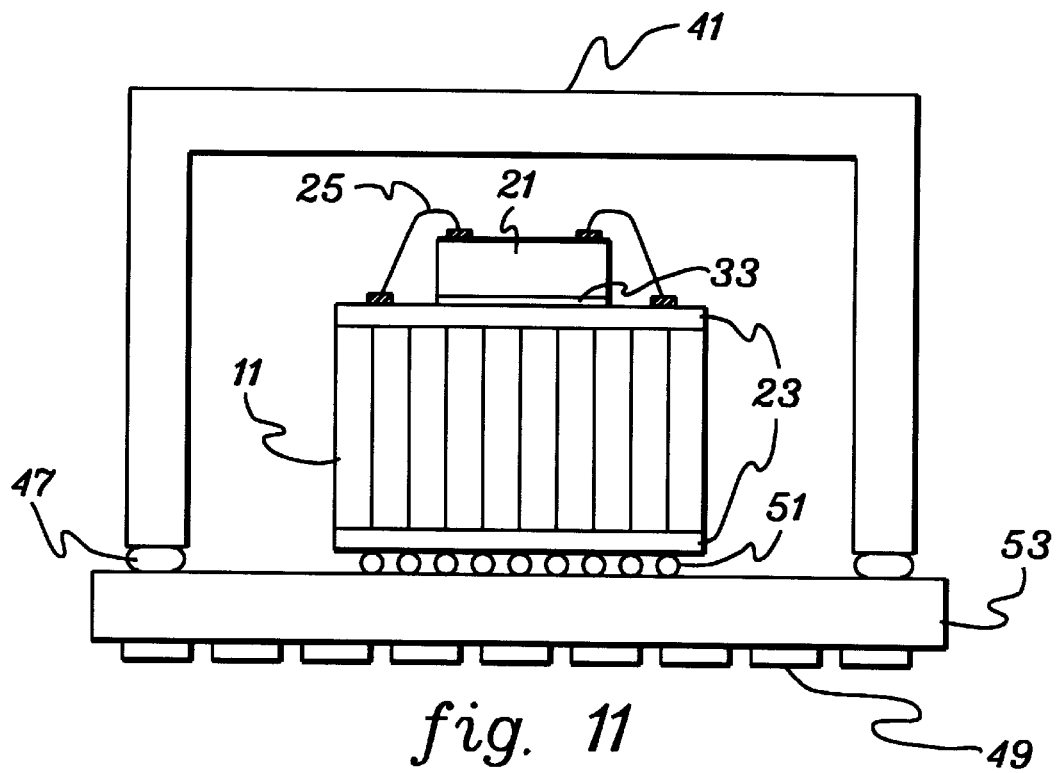
Figure 12:
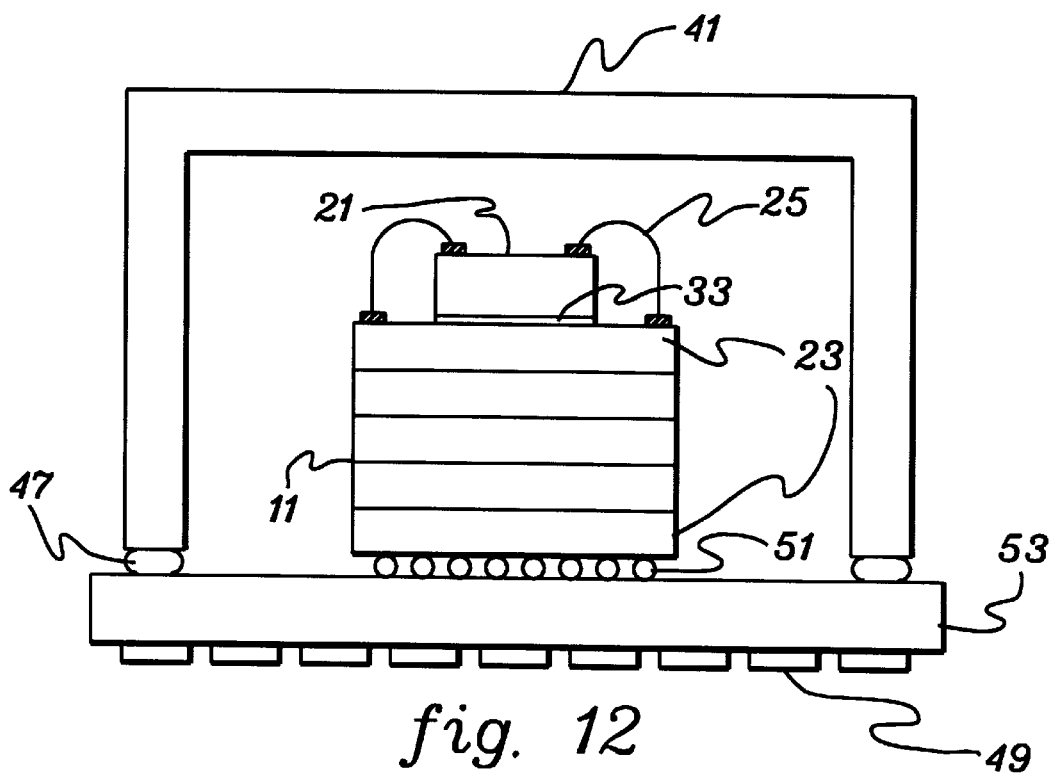

The electrical and physical connection of stack 11 to mounting substrate 53 may be performed in a variety of ways as shown in, e.g., FIGS. 10–12. As shown in FIG. 10, a "pancake" oriented stack is mechanically secured to mounting substrate 53 using an adhesive layer 33, while electrical connection therebetween is provided by wires 25.

In the electronic module of FIG. 11, a "breadloaf" orientation stack 11 is shown. Interposers 23 are disposed on opposite side surfaces of stack 11 and provide wiring and interconnection functionality. As one example, connection between the interposer's wiring and the side surface metallization layer of the stack (not shown) is provided by solder bumps (also not shown). The use of an interposer increases the wireability density between stack 11 of IC chips, sensor array 21 and substrate 53.

In the electronic module of FIG. 12, interposers 23 are used as endcaps on both ends of a "pancake" orientation stack 11 of IC chips. The lower endcap 23 is used for interconnecting the module's side surface wiring to an end surface of the module for facilitating solder bump 51 connections to mounting substrate 53.

Further examples of the use of cavity substrates, interposers and fabrication methods therefor, may be found in, for example, co-pending U.S. patent application entitled "METHOD AND WORKPIECE FOR CONNECTING A THIN LAYER TO A MONOLITHIC ELECTRONIC MODULE'S SURFACE AND ASSOCIATED MODULE PACKAGING," Ser. No. 08/313,976, filed Sep. 28, 1994 and hereby incorporated herein by reference in its entirety.

Figure 13:
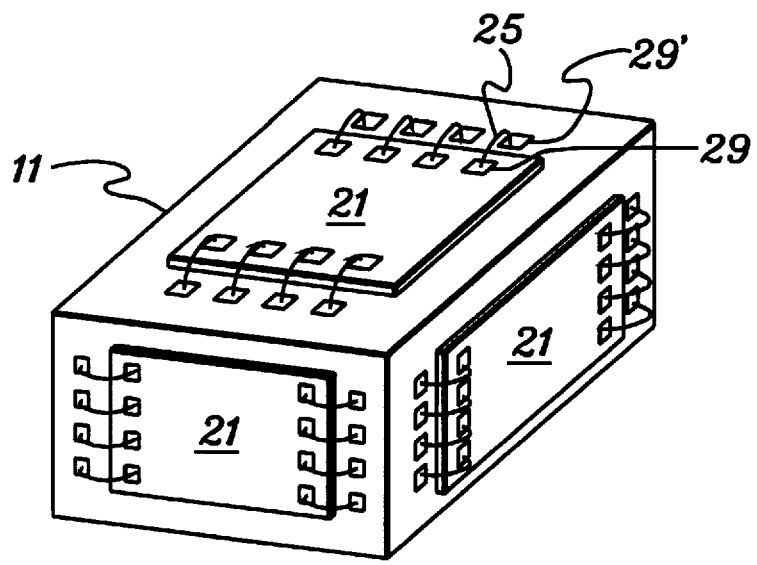
FIGS. 13–14 are isometric views of multi-view sensor modules pursuant to embodiments of the present invention.
Figure 14:
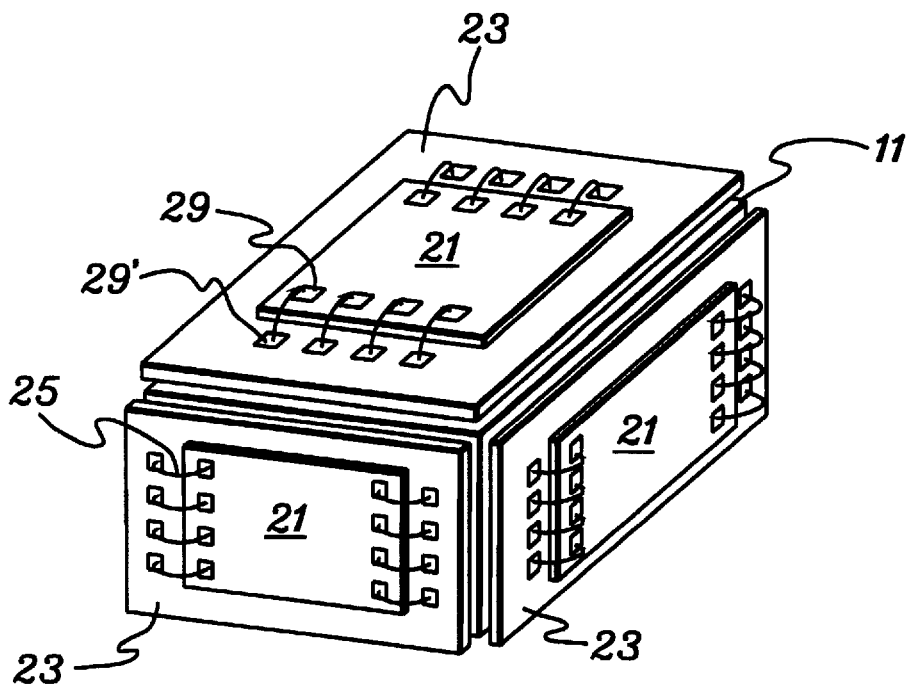

The techniques of the present invention may be applied to forming electronic modules with multi-directional sensing capability while achieving packaging densities heretofore unobtainable. To briefly summarize, sensor arrays may be disposed directly on multiple faces of stacks of bare IC chips. For example, FIGS. 13–14 show embodiments of the present invention wherein five of the six faces of a stack of IC chips have sensor arrays mounted thereto. The remaining face is used for interconnection to external circuitry (e.g, using conventional side-surface or end-surface connection techniques). As a result, an electronic module capable of, e.g., imaging in nearly a full sphere simultaneously is obtained with the addition of conventional external optics. Moreover, the processing power of the IC chips of the module facilitate enhanced functionality such as the "stitching" of the multiple images together to form a continuous spherical image.

Applications of such a multi-view imaging module include, e.g., surveillance, multi-media imaging and virtual reality. The need for large cumbersome multi-directional imaging devices is accordingly obviated. Thus, the multi-directional imaging module can be physically located in previously belied impossibly small places and provide heretofore unobtainable results. For example, in a surveillance application, a single, very small, imaging module could be located on the ceiling of a store in a fixed position and simultaneously image in all directions. The processing electronics within the module could provide image compression, time coding, zoom, pan, tilt, motion detection and infra-red imaging without any external processing or physical motion of the module. Further, e.g., the processing electronics could even be programmed to electronically "zoom in" and enhance areas of view within which motion is occurring. Essentially, any image processing function could be integrated into the module itself.

Two different techniques for coupling sensor arrays 21 to the faces of stack 11 are shown in FIGS. 13–14. In FIG. 13, sensor arrays 21 are directly mechanically coupled to the faces of stack 11 and are electrically connected to the circuitry of stack 11 through wires 25 that terminate at wirebond pads 29 and 29'. In FIG. 14, sensor arrays 21 are directly electrically and mechanically connected to interposers 23 (see, e.g., FIG. 11) that mechanically and electrically connect to the stack 11 surfaces.

Figure 15:
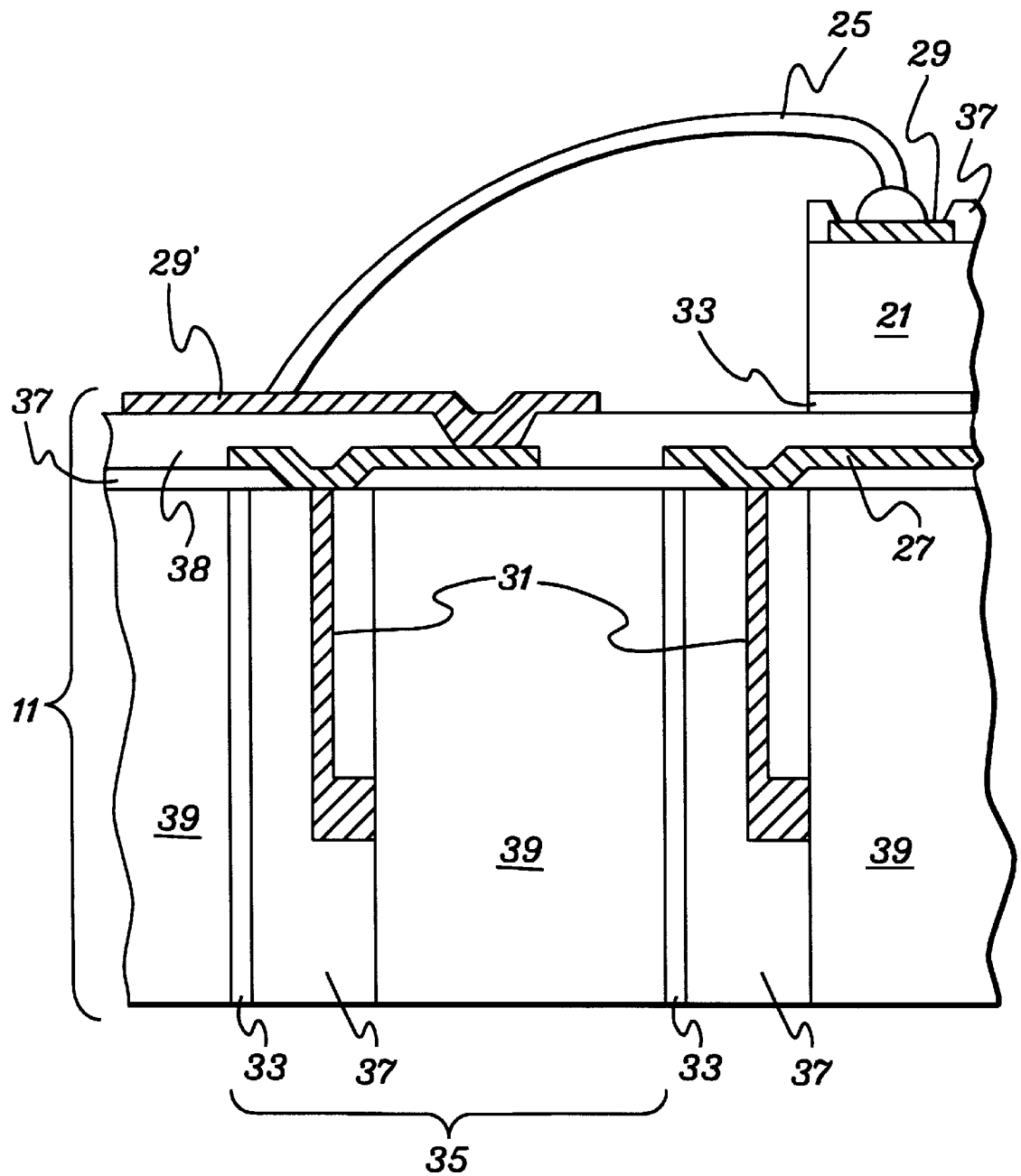
FIGS. 15–17 are cross-sectional views of multi-view sensor modules according to embodiments of the present invention.

More specifically, FIG. 15 shows further details of the connection of sensory arrays 21 to the side-surfaces of stack 11 of FIG. 13. Stack 11 includes multiple (bare) IC chips 35 which each include substrate 39 (having circuitry formed integral therewith) and insulating layer 37 (having transfer metal leads 31 disposed therewithin). A layer of adhesive 33 mechanically connects each IC chip 35 to an adjacent IC chip 35.

The stack further includes side-surface metallization layer 27 which electrically connects to transfer metal leads 31 of individual IC chips 35 of stack 11. Side-surface metallization 27 has patterned insulation layer 37 disposed below it to prevent shorting of side surface metallization layer 27 to silicon substrate 39 of IC chips 35, and has insulation layer 38 above it to facilitate formation of wirebond pads 29' which contact selected portions of side-surface metallization layer 27 for facilitating electrical contact thereto. Sensor array 21 is mechanically connected to the side-surface of stack 11 by adhesive 33. Electrical connection between wirebond pads 29 of sensor array 21 and wirebond pads 29' of stack 11 is provided by wires 25.

Each of sensor arrays 21 disposed on side-surfaces of stack 11 are similarly electrically and mechanically connected. However, alternate techniques for electrical connection are available. Transfer metal leads of each IC chip 35 could be designed to extend to one side surface of stack 11 and directly electrically connect to only one side-surface metallization layer 27. Other side surface metallization layers can be electrically connected to the side-surface metallization layer to which the transfer metal leads extend by, e.g., endcap wiring. It is also possible that wirebond pads 29' may be omitted and electrical connectivity of wires 25 may be directly made to side-surface metallization layer 27.

Figure 16:
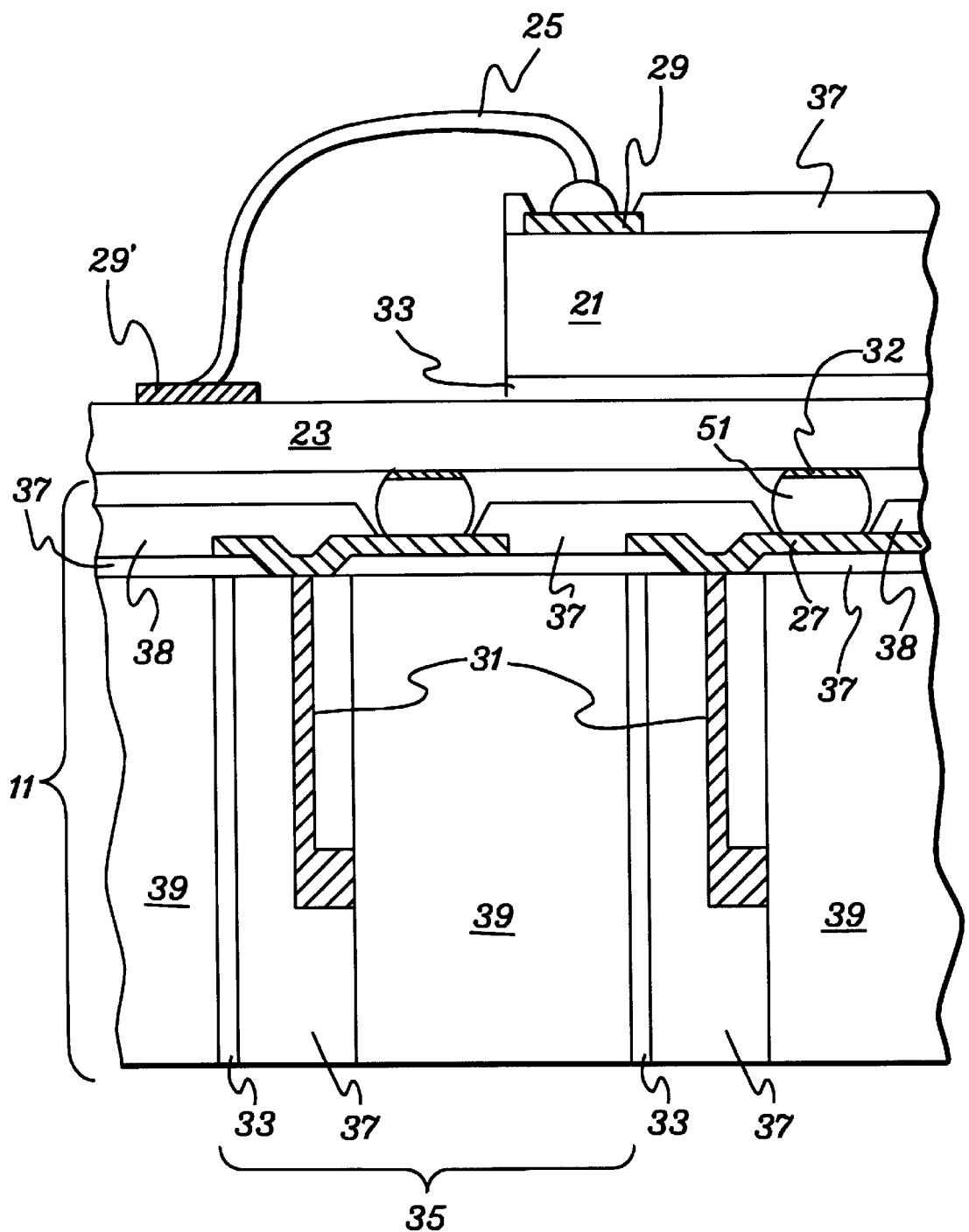

Shown in FIG. 16 are details of the connection of sensory arrays 11 to the side-surfaces of stack 11 of FIG. 14. As discussed with respect to FIG. 15, stack 11 includes multiple (bare) IC chips 35 which each include substrate 39 (having circuitry formed integral therewith) and insulating layer 37 (having transfer metal leads 31 disposed therewithin). A layer of adhesive 33 mechanically connects each IC chip 35 to an adjacent IC chip 35. Further, stack 11 includes side-surface metallization layer 27 which electrically connects to transfer metal leads 31 of individual IC chips 35 of stack 11. Side-surface metallization 27 has patterned insulation layer 37 disposed below it to prevent shorting thereof to silicon substrate 39 of IC chips 35, and has patterned insulation layer 38 above it to facilitate selective electrical contact thereto.

Sensor array 21 is mechanically and electrically connected to the side-surface of stack 11 by interposer 23. More specifically, interposer 23 is electrically and mechanically connected to the side-surface of stack 11 by solder balls 51. The solder balls electrically and mechanically connect between side surface metallization layer 27 of stack 11 and contact pads 32 of interposer 23. Interposer 23 itself may comprise any conventional interposer (discussed hereinabove) and in the preferred embodiment comprises a ceramic interposer having internal wiring terminating at contact pads 32 and wirebond pads 29. Electrical connection between wirebond pads 29' of interposer 23 and wirebond pads 29 of sensor array 21 is provided by wires 25. Sensor array 21 is mechanically coupled to the side-surface of stack 11 using adhesive layer 33.

The use of interposer 23 to connect sensor arrays 21 to the surfaces of stack 11 simplifies side-surface wiring 27. Specifically, complicated signal re-routing wiring that is normally implemented by side-surface wiring 27 may be migrated into interposer 23. Such signal re-routing is technically easier and less costly to implement within interposer 23.

Electrical and mechanical connection of sensor arrays 21 to end-surfaces of stack 11 may be performed in a similar manner to that shown in, and described hereinabove with respect to, e.g., FIGS. 4, 6, 7, and 10–12.

As an enhancement, the region between interposer 23 and insulating layer 37 on the side surface of stack 11 can be filled with a polymeric encapsulant material to enhance the thermomechanical fatigue resistance of solder balls 51.

Figure 17:
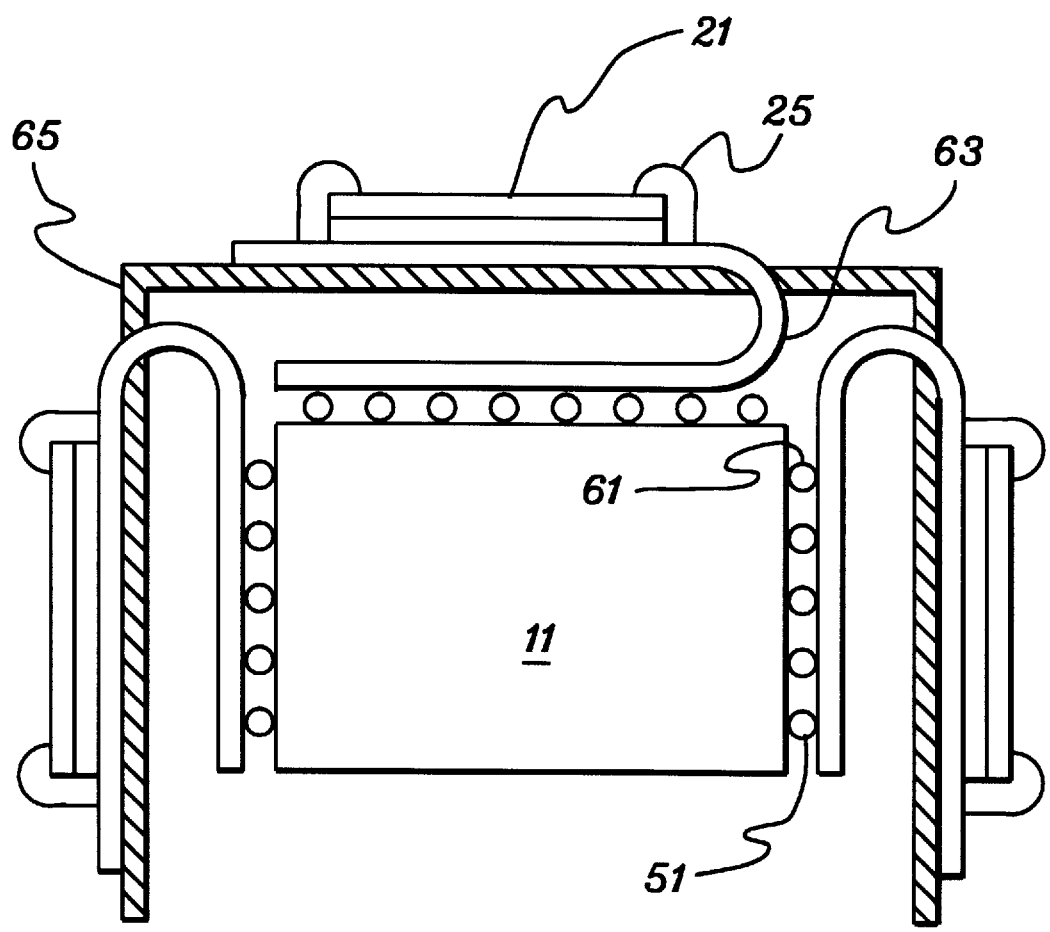

A further embodiment of a multi-view electronic module of the present invention is shown in the cross-sectional view of FIG. 17. In this embodiment, a support frame 65 is used to provide a structural mounting surface for sensor arrays 21. More specifically, each sensor array 21 is adhesively secured to a flexible interposer 63 which is secured to support frame 65. Electrical connectivity between each sensor array 21 and the particular flexible interposer 63 it is secured to is provided by conventional wires 25.

Each flexible interposer 63 is electrically and mechanically secured to a corresponding surface of stack 11. Solder balls 51 both electrically and mechanically connect each flexible interposer 63 to a corresponding surface of stack 11 thereby mechanically and electrically coupling each surface of stack 11 to a corresponding sensor array 21.

Advantageously, the use of support frame 65 and flexible interposers 63 facilitates many sizing options for the individual components of the multi-view electronic module. For example, support frame 65 can accommodate a variety of sizes of sensor arrays 21, and a wide variety of sizes of stacks 11. Many overall packaging options are therefore made possible. Several different types of lenses and optically transparent covers may be disposed over the multi-view module to facilitate, e.g., surveillance applications wherein sensor arrays 21 comprise CCD arrays.

The individual processing steps for fabricating the structures of the present invention will be apparent in view of the ordinary knowledge of one skilled in the art of semiconductor packaging in view of all of the above disclosure and documents incorporated thereby.

While the invention has been described in detail herein, in accordance with certain preferred embodiments thereof, many modifications and changes thereto may be affected by those skilled in the art. Accordingly, it is intended by the appended claims to cover all such modifications and changes as fall within the true spirit and scope of the invention.

We claim:

1. An electronic module comprising:
   a substrate having a cavity therein which defines a first supporting level of said substrate within said cavity;
   a processing module mechanically connected to said first supporting level, said processing module comprising a stack of bare chips;
   a sensor assembly disposed within said cavity and mechanically coupled to said substrate; and
   electrical connection means between said processing module and said sensor assembly.

2. The electronic module of claim 1, wherein said substrate further includes a second support level defined by, and disposed within, said cavity, and wherein said sensor assembly is mechanically connected to said second support level.

3. The electronic module of claim 2, wherein said second support level comprises at least one ledge disposed within said cavity, said at least one ledge being above an uppermost level of said processing module, said sensor assembly being supported by, and mechanically connected to, said at least one ledge.

4. The electronic module of claim 2, wherein said sensor assembly comprises a sensor substrate, a sensor array and a logic IC chip, said sensor substrate being electrically and mechanically connected to said sensor array and said logic IC chip.

5. The electronic module of claim 4, wherein said sensor substrate has a first main surface and a second main surface, and wherein said logic IC chip is disposed on, and mechanically connected to, said first main surface, and said sensor array is disposed on, and mechanically coupled to, said second main surface.

6. The electronic module of claim 4, wherein said sensor substrate has two main surfaces, and wherein said logic IC chip and said sensor array are both disposed on, and mechanically connected to, a first main surface of said two main surfaces.

7. The electronic module of claim 2, wherein said substrate further includes a cover support level within said cavity and disposed above said sensor assembly, and wherein said electronic module further comprises a cover that is supported by, and mechanically connected to, said cover support level.

* * * * *